(12) United States Patent
Kashiwagi et al.

(10) Patent No.: US 6,176,007 B1
(45) Date of Patent: Jan. 23, 2001

(54) EQUIPMENT AND METHOD FOR MOUNTING ELECTRONIC COMPONENTS

(75) Inventors: Yasuhiro Kashiwagi, Maebaru; Kazuhide Nagao, Fukuoka; Jun Yamauti, Kurume; Takeshi Morita, Chikushino, all of (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/077,331

(22) PCT Filed: Nov. 21, 1996

(86) PCT No.: PCT/JP96/03411

§ 371 Date: Aug. 7, 1998

§ 102(e) Date: Aug. 7, 1998

(87) PCT Pub. No.: WO97/20455

PCT Pub. Date: Jun. 5, 1997

(30) Foreign Application Priority Data

Nov. 27, 1995 (JP) .................................................. 7-307084
Jan. 19, 1996 (JP) .................................................. 8-007074

(51) Int. Cl.[7] .................................................. B23P 19/00
(52) U.S. Cl. .................................. 29/729; 29/709; 29/721; 29/729; 29/740; 29/741; 29/742; 29/743; 29/832
(58) Field of Search .......................... 29/740, 741, 742, 29/743, 832, 564.1, 703, 721, 33 M, 729

(56) References Cited

U.S. PATENT DOCUMENTS

| 4,868,977 | * | 9/1989 | Maruyama et al. | 29/823 |
| 5,342,460 | * | 8/1994 | Hidese | 156/64 |
| 5,402,564 | * | 4/1995 | Tsukasaki et al. | 29/832 |
| 5,456,001 | * | 10/1995 | Mori et al. | 29/739 |
| 5,588,195 | * | 12/1996 | Asai et al. | 29/33 M |
| 5,651,176 | * | 7/1997 | Ma et al. | 29/740 |
| 5,729,892 | * | 3/1998 | Umemura et al. | 29/739 |
| 5,740,604 | * | 4/1998 | Kitamura et al. | 29/832 |
| 5,743,005 | * | 4/1998 | Nakao et al. | 29/833 |
| 5,867,897 | * | 2/1999 | Mimura et al. | 29/840 |
| 5,894,657 | * | 4/1999 | Kanayama et al. | 29/740 |

FOREIGN PATENT DOCUMENTS

| 1-117397 | 5/1989 | (JP) . |
| 4-241498 | 8/1992 | (JP) . |
| 4-354400 | 12/1992 | (JP) . |
| 6-247512 | 9/1994 | (JP) . |

* cited by examiner

*Primary Examiner*—Lee Young
*Assistant Examiner*—Binh-An Nguyen
(74) *Attorney, Agent, or Firm*—Wenderoth, Lind & Ponack, L.L.P.

(57) ABSTRACT

The cycle time for mounting electronic components supplied from a tray can be shortened. An electronic component feeder (16) for mounting electronic components has a plurality of height levels (L1, L2, and L3) and can move tables (19, 20, 21) horizontally at the respective levels (L1, L2, and L3). A plurality of conveyers (22, 23, 24) are provided for the respective tables to move them to a pickup stage (A) from a standby stage (B). Transfer head (13) includes nozzles (14a, 14b, 14c) for attracting electronic components by suction, and an upward-downward moving mechanism which moves the nozzles in accordance with the height level of each tray on the pickup stage (A). Since the trays are arranged at the different height levels at the pickup stage position, the conveyers can be moved independently and the transfer heads can individually move the nozzles between the position at which each nozzle picks up electronic components and another position at which the nozzle does not interfere with the pickup operation. Movement of a necessary tray from and to the pick up stage position can be performed quickly without being hindered by an other tray and, as a result, the cycle time for mounting electronic components can be shortened.

4 Claims, 10 Drawing Sheets

EQUIPMENT AND METHOD FOR MOUNTING ELECTRONIC COMPONENTS

FIELD OF THE INVENTION

The present invention relates to mounting electronic components using more than one nozzle provided on a transfer head for picking up electronic components placed on more than one vertically-staged tray, and transferring and mounting them onto a substrate.

BACKGROUND OF THE INVENTION

At present, a common type of electronic component mounting equipment picks up a selection of electronic components supplied via an electronic component feeder by vacuum suction of a transfer head nozzle and transfers and mounts them onto a substrate. There are various types of feeders which supply electronic components to the nozzle of the transfer head, and one type employs a tray.

An electronic component feeder of the prior art which employs this tray is explained next.

Figure 13:
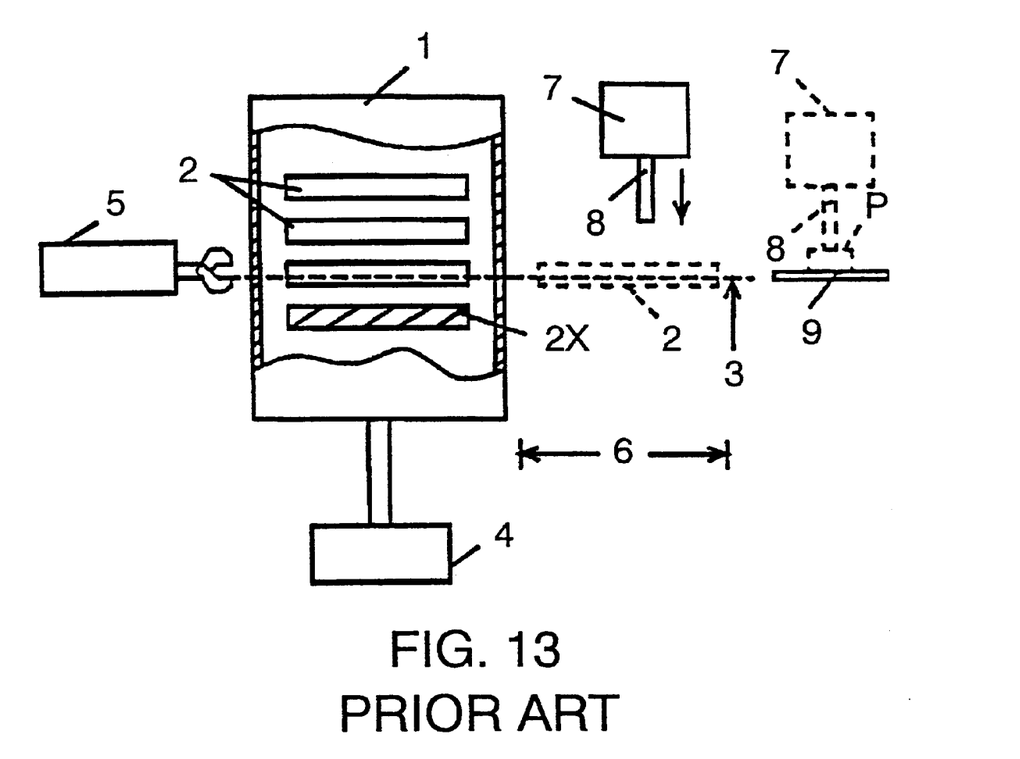
FIG. 13 is a side view of an electronic component feeder of the prior art.

FIG. 13 shows a side view of an electronic component feeder of the prior art. In FIG. 13, a magazine 1 houses a tray 2 which stores more than one electronic component aligned lengthwise and crosswise in vertical multiple stages. A certain in/out level 3 is specified in the conventional electronic component feeder, and the magazine 1 is raised or lowered by elevation means 4 to move the tray 2 to this in/out level 3 for moving the tray 2 to a subsequent pickup stage 6 next. In/out means 5 is for ejecting the tray 2 at the in/out level 3 from the magazine 1 to the pickup stage 6, or to return the tray 2 on the pickup stage 6 to the magazine 1.

When the tray 2 required to be on the pickup stage 6 (refer to the tray 2 represented by a dotted line) is ejected, a nozzle 8 of a transfer head 7 lowers toward the tray 2, and an electronic component P on the tray 2 is picked up by suction at the tip of the nozzle 8. The electronic component P, shown by a dotted line, is then transferred and mounted onto a substrate 9, for example, a printed circuit board.

With the above electronic component feeder of the prior art, however, a long time is required to replace the tray 2 positioned on the pickup stage 6, resulting in a longer feeding cycle time, which in turn lowers productivity. The reasons are as follows. For replacing the tray 2 shown by the dotted line in FIG. 13 with the tray 2x in the magazine 1, the following series of operations cannot be avoided:

(1) the in/out means 5 returns the tray 2 from the pickup up stage 6 to the magazine 1;

(2) the elevation means 4 raises the magazine 1 to set the tray 2x to the in/out level 3; and (3) the in/out means 5 ejects the tray 2x set to the in/out level 3 to the pickup stage 6.

SUMMARY OF THE INVENTION

The present invention provides a method and equipment for mounting electronic components which enables the shortening of feeding cycle time, and which also allows the high speed transfer and mounting of electronic components onto a substrate.

The electronic component mounting equipment of the present invention comprises a positioning unit for positioning a substrate, an electronic component feeder for supplying electronic components, and a transfer head which moves between the electronic component feeder and the positioning unit for transferring and mounting supplied electronic components onto a positioned substrate. The abovementioned electronic component feeder comprises tray holders for holding a tray storing more than one electronic component, a frame support having more than one vertical stage for the tray holders so as to move each tray holder horizontally at each height level, and more than one in/out means moving mechanism disposed for the tray holders for transferring each tray holder from a standby stage to a pickup stage. The abovementioned transfer head comprises a nozzle for suctioning electronic components and a vertical movement mechanism for moving the nozzle in accordance with a height of each tray on the pickup stage.

The electronic component mounting method of the present invention is to move electronic components stored on a tray to the pickup stage, pick up an electronic component using the nozzle of the transfer head, and mount it on the substrate. In this method, more than one level for ejecting and returning the tray to and from the pickup stage is provided with a certain interval in the vertical direction. The tray is ejected at each level for positioning the tray on the pickup stage, and the electronic component on the tray is then picked up with the nozzle to be mounted on the substrate.

The electronic component mounting method of the present invention further picks up electronic components on the trays set at more than one vertical level of the pickup stage with more than one vacuum suction nozzle provided on the transfer head, and transfers and mounts the electronic component onto a substrate positioned with the positioning unit. The transfer head is moved over the trays disposed on the plurality of vertical stages, and electronic components are picked up in order from the upper tray to the lower tray by moving more than one nozzle vertically in order. When one nozzle is lowered for picking up an electronic component, other nozzles which do not pick up electronic components also lower together.

The electronic component mounting equipment as configured above operates as follows.

Each tray can be independently ejected to and returned from the pickup stage at different levels. The nozzle of the transfer head also moves vertically in response to the level of the tray positioned on the pickup stage by the vertical movement mechanism. This allows prompt setting up of the required tray at the pickup stage as required for picking up the electronic component with the nozzle to immediately mount it on the substrate. In other words, the present invention enables the saving of time required for elevating the magazine and ejecting or returning the tray after elevation, which is unavoidable with the electronic component mounting equipment of the prior art. Accordingly, the mounting cycle time can be reduced.

Moreover, by providing more than one level with a certain interval in the vertical axis for ejecting or returning the tray at each level to and from the pickup stage, the ejection or returning operation of a required tray can be promptly executed without interfering with other trays, also resulting in a reduction of the mounting cycle time. Furthermore, by disposing the transfer head over the trays disposed in more than one vertical stage, electronic components are picked up in order from the upper to the lower trays by the vertical movement of more than one nozzle. Those nozzles which do not pick up electronic components also lower together with the nozzle which lowers to pick up electronic components. This allows the reduction of the cycle time required for picking up electronic components on the tray by moving the nozzle vertically and the cycle time required for moving the nozzle over the substrate and then moving vertically again to mount the electronic component on the substrate. Thus, electronic components on the tray can be mounted on the substrate at high speed with good operability.

DESCRIPTION OF THE PREFERRED EMBODIMENT

An exemplary embodiment of the present invention is explained with reference to drawings.

Figure 1:
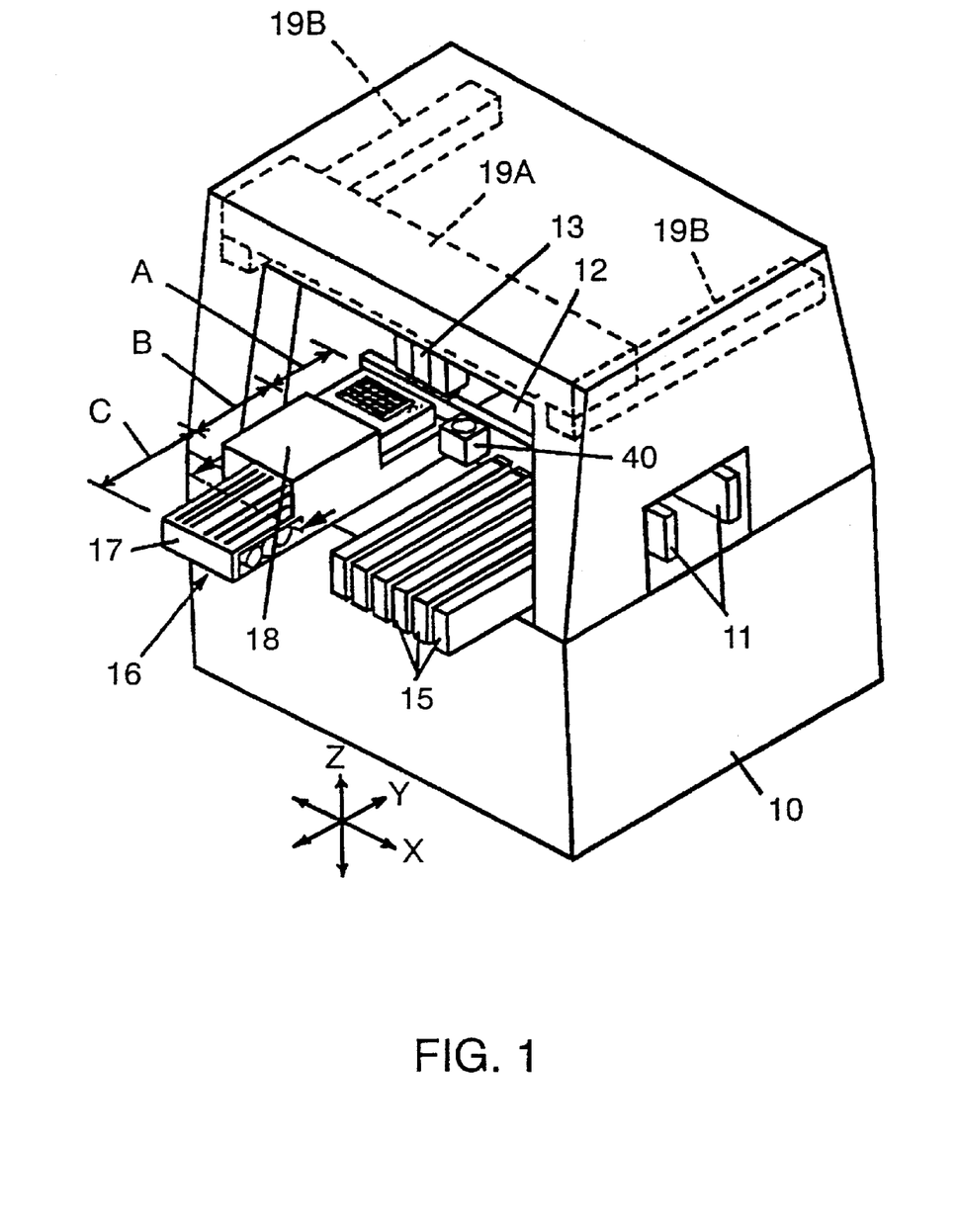
FIG. 1 is a perspective of electronic component mounting equipment in accordance with an exemplary embodiment of the present invention.

One exemplary embodiment of electronic component mounting equipment of the present invention is explained with reference to FIGS. 1 to 4. In FIG. 1, arrows X, Y, and Z indicate directions. A conveyor 11 is provided over a long distance in the X direction on a top face of a base 10 for transporting a substrate 12 and functioning as a substrate positioning unit for positioning the substrate 12 at a specified position. A transfer head 13 comprises more than one nozzle, for picking up electronic components with vacuum suction at their tips. The transfer head 13 is horizontally movable in X and Y directions on the base 10 by an X table 19A and a Y table 19B. An electronic component monitoring unit 40 is disposed at the side of the conveyor 11. A transfer direction of the substrate 12 by the conveyor 11 is the X direction.

An electronic component feeder 16 is for supplying electronic components. A frame 17 of the electronic component feeder 16 is fixed to the base 10. The electronic component feeder 16 is disposed with a side toward the conveyor 11, and comprises a pickup stage A, which is an area for picking up an electronic component by suction with a nozzle of the transfer head 13, a standby stage B at the center, and a refill stage C which is disposed at the opposite side of the pickup stage A for refilling electronic components by replacing an empty tray with another tray. A cover 18 is provided over the standby stage B. A parts feeder 15 is for supplying electronic components which are not provided in trays (e.g. a tape feeder and a tube feeder).

Figure 2:
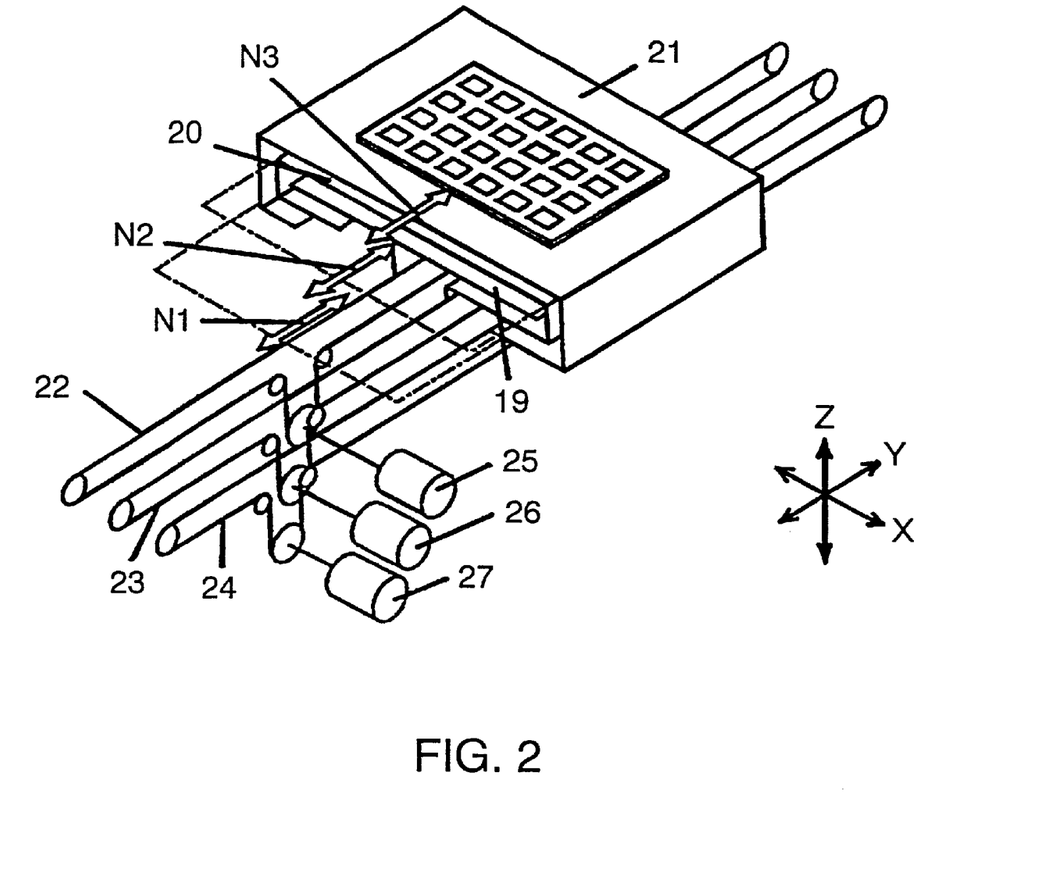
FIG. 2 is a perspective of a part of the electronic component mounting equipment of the present invention.

An outline of the internal structure of the electronic component feeder 16 is explained with reference to FIG. 2. As shown in FIG. 2, the electronic component feeder 16 of the exemplary embodiment of the present invention has three tables, which are a first table 19, a second table 20, and a third table 21 from the bottom. The first table 19 is connected to a first conveyor 22, the second table 20 to a second conveyor 23, and the third table 21 to a third conveyor 24. The first conveyor 22 is driven independently by a first motor 25, the second conveyor 23 by a second motor 26, and the third conveyor 24 by a third motor 27. Accordingly, the first table 19, second table 20, and third table 21 can be independently taken in and out in the direction shown by arrows N1, N2, and N3. The first table 19, second table 20, and third table 21 are equivalent to a tray holder for holding the tray, and the first conveyor 22, second conveyor 23, and third conveyor 24 are equivalent to the in/out means.

Figure 3:
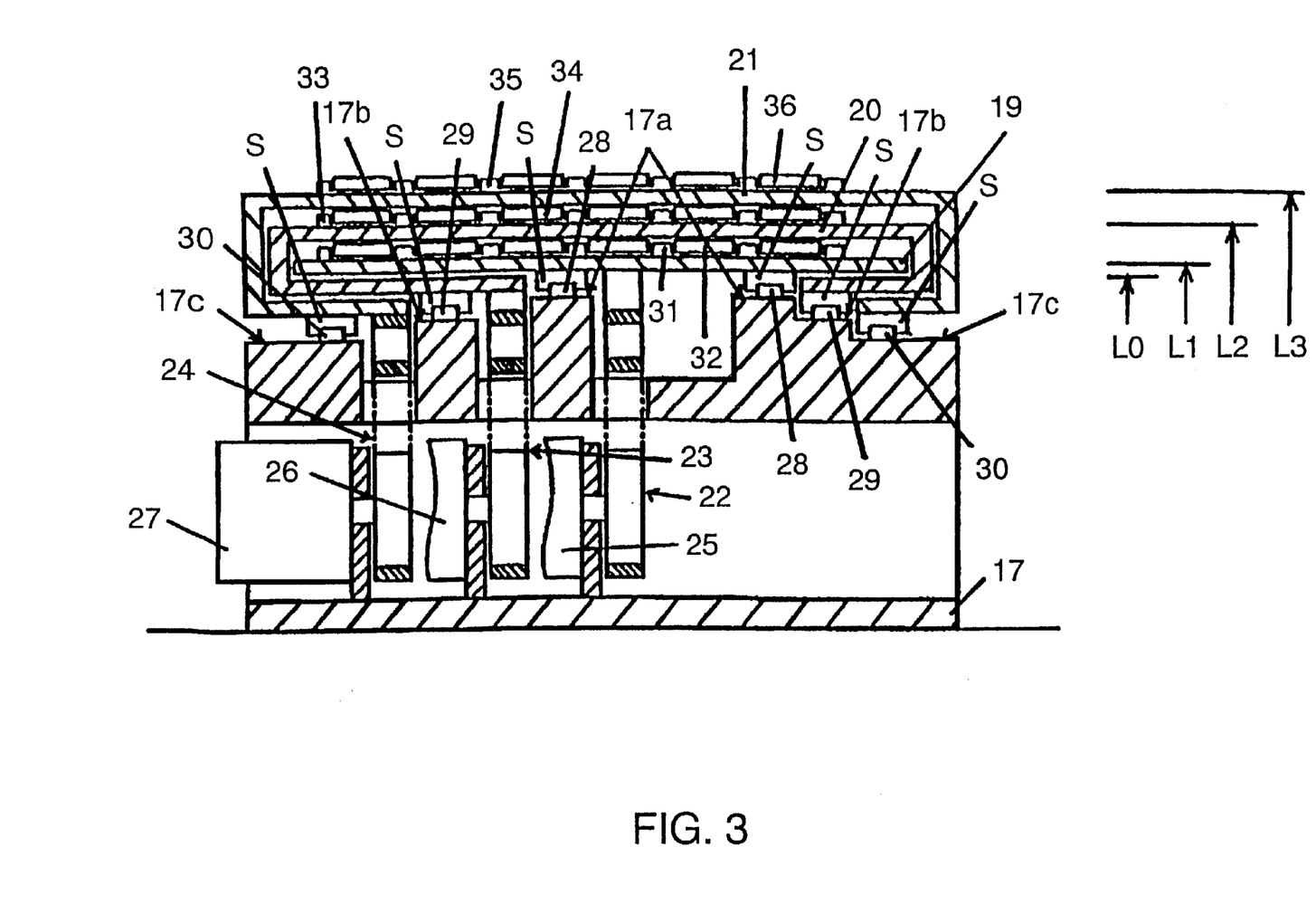
FIG. 3 is a section view of the electronic component mounting equipment of the present invention.

Detailed structure of the electronic component feeder 16 of the exemplary embodiment of the present invention is explained with reference to FIG. 3. As shown in FIG. 3, a first stage 17a, second stage 17b, and third stage 17c are provided on the upper part of the frame 17, and they are stepped downward from the center to the outside. A slider S fixed to the bottom face of the first table 19 is fitted in slidable fashion to the first guide 28 fixed to the first stage 17a. In the same way, the second table 20 and the third table 21 are supported in slidable fashion respectively by the second guide 29 fixed to the second stage 17b and the third guide 30 fixed to the third stage 17c. A first tray 31 stores the first electronic component 32 and is placed on the first table 19, a second tray 33 stores the second electronic component 34 and is placed on the second table 20, and a third tray 35 stores the third electronic component 36 and is placed on the third table 21. Here, in each tray placed on each table, the first tray 31 is positioned at the first level L1, which is the bottom stage, the second tray 33 is positioned at the second level L2, which is the middle stage, and the third tray 35 is positioned at the third level L3, which is the top stage. The level L0 is a monitoring level for electronic components (to be explained later).

The side of the second table 20 is bent vertically downward at the outside of the first table 19, and then bent perpendicularly towards the frame 17 at the bottom of the first table 19, reaching the slider S. In other words, the side of the second table 20 detours around the first table 19 and bends towards the center of the frame so that the structure of the electronic component feeder 16 can be made more compact by minimizing the width of the second table 20. With the same intention, the side of the third table 21 is designed to detour around the second table 20, and is bent towards the center of the frame 17 to reach the slider S.

Next, the structure of the transfer head 13 and a monitoring unit 40 is explained with reference to FIG. 4. The transfer head 13 comprises a first nozzle 14a, second nozzle 14b, and third nozzle 14c which move vertically and independently from each other. As explained later, they pick up the first electronic component 32, second electronic component 34, and third electronic component 36, respectively, by suction, and transfer and mount them on the substrate 12.

The first nozzle 14a, second nozzle 14b, and third nozzle 14c have the same vertical movement mechanism. These nozzles comprise a head frame 51, a feeding screw 52 which is vertically held by the head frame 51, a z-axis motor 53 which is mounted onto the upper part of the head frame 51 for rotating the feeding screw 52, a nut 54 which is hinged to the feeding screw 52, and moves vertically when the feeding screw 52 is rotated, a nozzle shaft 55 vertically provided on the nut 54, and a round back plate 56 attached to the nozzle shaft 55. The nozzle shaft 55 rotates by an angle θ when driven by a head motor 57 and a belt 58. Accordingly, when the z-axis motor 53 rotates clockwise or counterclockwise, the nut 54 moves upward or downward along the feeding screw 52, and the first nozzle 14a, second nozzle 14b, and third nozzle 14c move upward or downward. When the head motor 57 rotates, the nozzle shaft 55 rotates by angle θ for correcting the horizontal rotation angle of the electronic component picked up by suction at the tip of the first nozzle 14a, second nozzle 14b, and third nozzle 14c.

The monitoring unit 40 is configured to house a line sensor 42 inside a box 41. The longer side of the line sensor 42 is provided along the Y axis, and a slit 43 is opened corresponding to the line sensor 42 at the upper face of the box 41. The transfer head 13 moves perpendicularly (along the X axis) to the direction of the line sensor 42 (y axis) over the slit 43. The first nozzle 14a, second nozzle 14b, and third nozzle 14c are arranged in a line along the X axis. Accordingly, the first electronic component 32, second electronic component 34, and third electronic component 36, picked up by suction at the tip of each nozzle, traverse the line sensor 42 as the transfer head 13 linearly moves along the X axis. This enables continuous high speed monitoring of these electronic components to detect any deviation in the x, y, and θ directions.

Next, a first example of an electronic component mounting method in the exemplary embodiment of the present invention is explained.

Figure 5A:
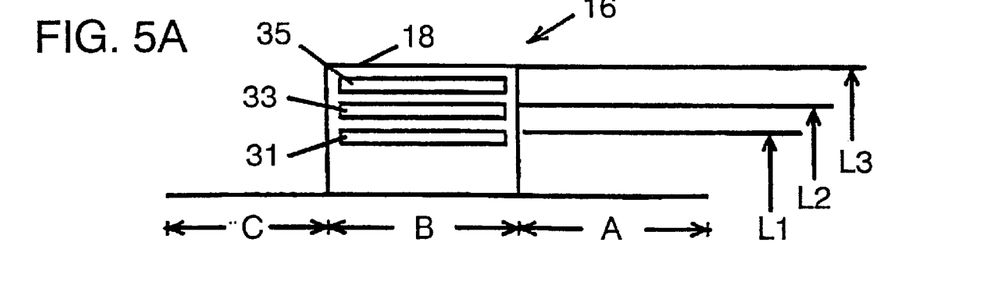
FIGS. 5A–5D explain a first example of processes of an electronic component mounting method of the present invention.
Figure 5B:
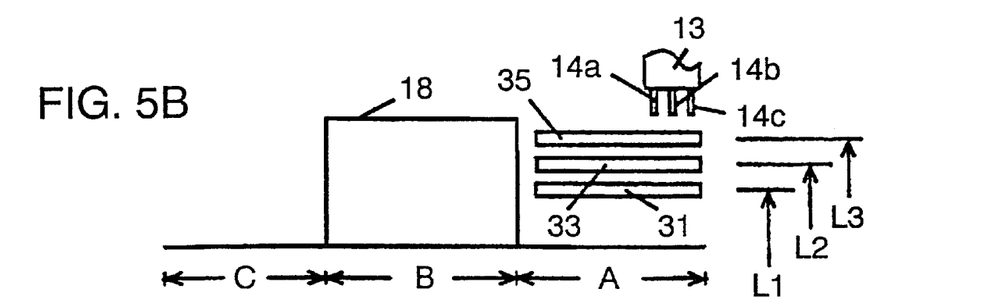

FIGS. 5A–5D explain processes of a first example of the electronic component mounting method. As shown in FIG. 5A, the first tray 31, second tray 33, and third tray 35 are placed on the standby stage B. Next, in FIG.5B, the first tray 31, second tray 33, and third tray 35 are moved to the pickup stage A at once before the transfer head 13 reaches the pickup stage A. Then, at the third level L3, the first nozzle 14a picks up the third electronic component 36 from the third tray 35 on the top stage.

Figure 5C:
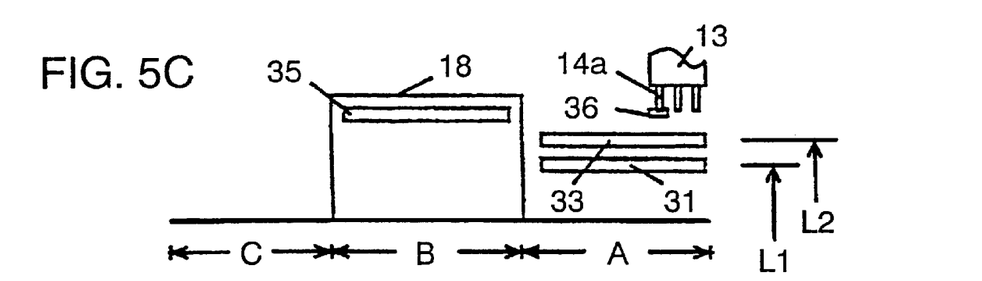

After completing the pickup operation at the third level L3, the third tray 35 immediately returns to the standby stage B as shown in FIG. 5C. After the third tray 35 returns, the second nozzle 14b immediately picks up the second electronic component 34 from the second tray 33 at the second level L2, and mounts it on the substrate 12. Here, the present invention saves the time spent for elevating the magazine or ejecting the next tray to the pickup stage A as required with the electronic component mounting equipment of the prior art, enabling a reduction of the electronic component mounting time.

Figure 5D:
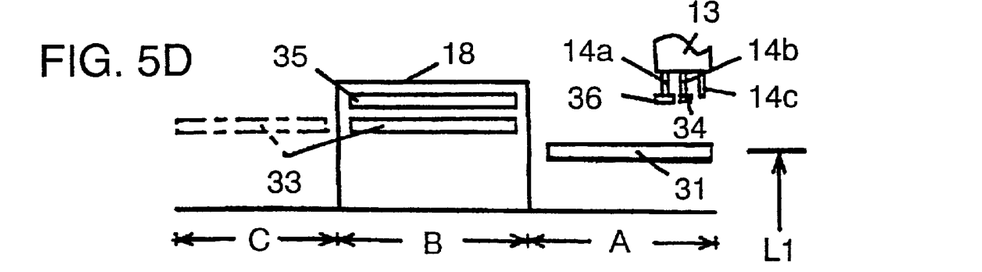

After completing the pickup operation for the second tray 33, the second tray 33 is immediately returned to the standby stage B as shown in FIG. 5D. The first electronic component 32 on the first tray 31 positioned at the first level L1 is then picked up. When the second tray 33 at the standby stage B becomes empty, the second tray 33 is moved to the refill stage C (shown by a chain line), and the tray is refilled by replacing it with a new tray full of second electronic components 34. The electronic components 36, 34, and 32 can be mounted onto the substrate 12 after picking up all of them.

Next, a second example of the electronic component mounting method in the exemplary embodiment of the present invention is explained.

Figure 6A:
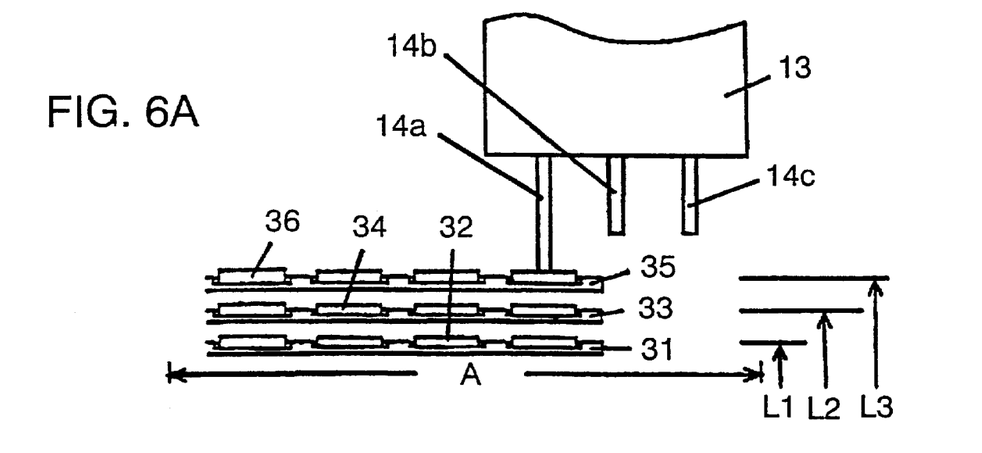
FIGS. 6A–6C explain a second example of processes of the electronic component mounting method of the present invention.
Figure 6B:
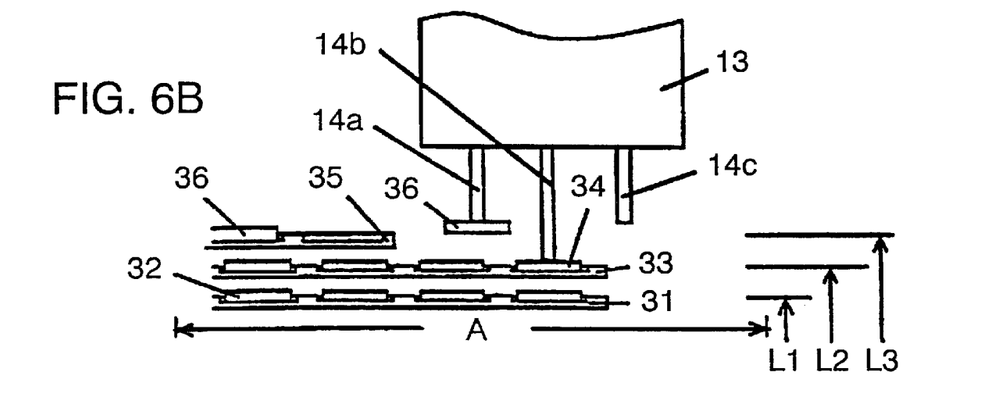
Figure 6C:
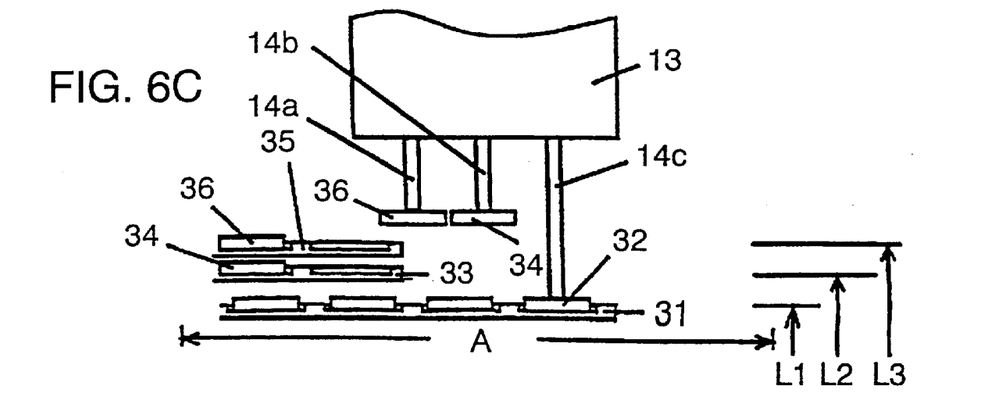

FIGS. 6A–6C explain processes of the second example of the electronic component mounting method. In this example, trays are not required to be returned to the standby stage B as in the first example explained above. The trays can be switched with only a small returning operation. Specifically, the first tray 31, second tray 33, and third tray 35 are first aligned as show in FIG. 6A, and the first nozzle 14a picks up the third electronic component 36 from the third tray 35. Next, the third tray 35 is returned relative to the first tray 31 and second tray 33 over double the length of the alignment pitch of the electronic components, and the transfer head 13 is moved only for the length of the electronic component alignment pitch for picking up the second electronic component 34 from the second tray 33 with the second nozzle 14b. As shown in FIG. 6C, the second tray 33 is returned over the same distance as the third tray 35 so that only the first tray 31 protrudes from the second tray 33 and the third tray 35. The first electronic component 32 is then picked up from the first tray 31 with the third nozzle 14c.

Then, the transfer head 13 is moved over the substrate 12, and the third electronic component 36, second electronic component 34, and first electronic component 32 that have been picked up are mounted onto the substrate 12. In this way, the stroke for returning the second tray 33 and third tray 35 can be minimized to the degree required to avoid interfering with pickup of the first electronic component 32 from the first tray 31 on the lowest stage, enabling a shortening of the time required for mounting electronic components.

A third example of the electronic component mounting method in the exemplary embodiment of the present invention is explained next.

Figure 7:
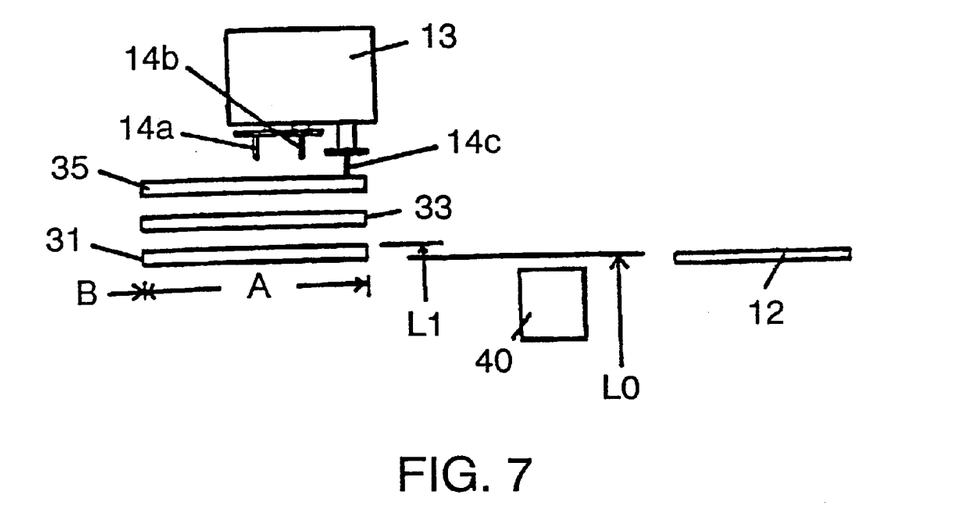
FIGS. 7, 8, 9, 10, 11, and 12 explain a third example of processes of the electronic component mounting method of the present invention.

FIGS. 7 to 12 explain processes of the third example of the electronic component mounting method, showing the sequence of operations. Specifically, as shown in FIG. 7, the first tray 31, second tray 33, and third tray 35 are taken out from the standby stage B to the pickup stage A. Here, the first level L1 of the first tray 31 on the lowest stage is completely leveled or approximately leveled to the monitoring level L0 for electronic components and the upper face level of the substrate 12 (electronic component mounting level). The reason is explained later.

As shown in FIG. 7, the transfer head 13 is moved over the pickup stage A. At first, the first nozzle 14a, second nozzle 14b, and third nozzle 14c are set to the highest level, and only the third nozzle 14c is first lowered and raised to pick up the third electronic component 36 in the third tray 35 at the top stage by suction.

Figure 8:
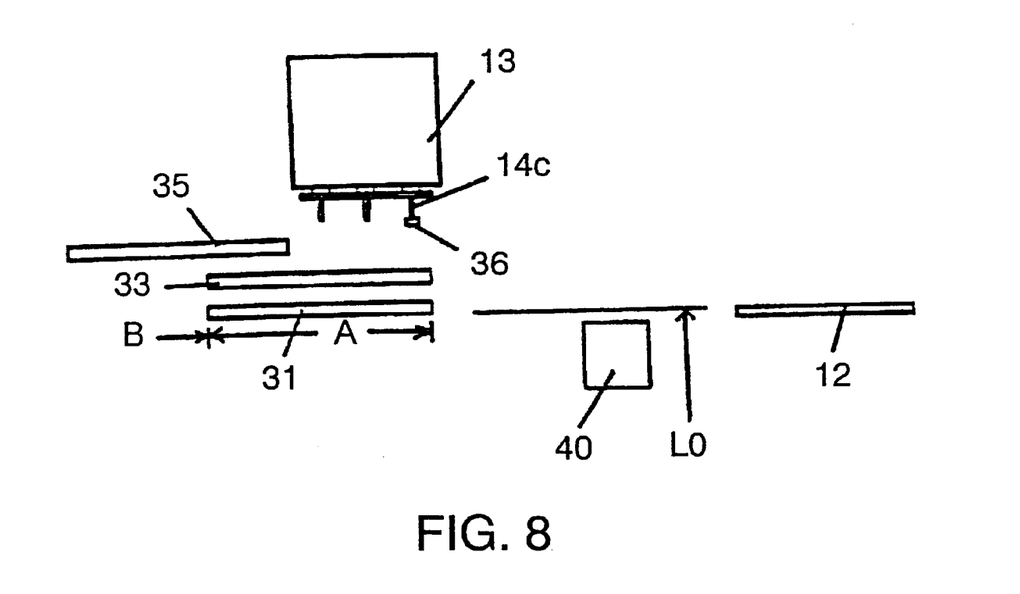
Figure 9:
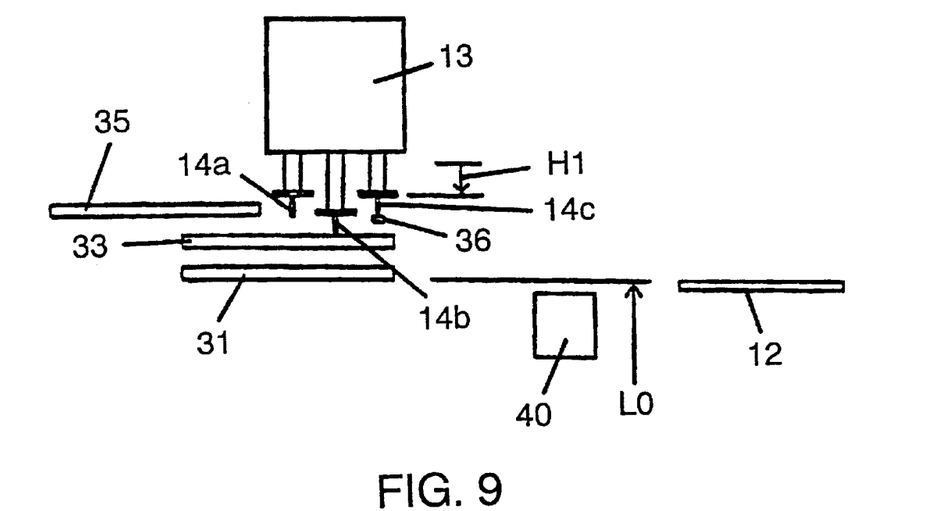

Next, as shown in FIG. 8, the third tray 35 returns to the standby stage B, to expose the second tray 33. The second nozzle 14b is then lowered or raised to pick up the second electronic component 34 as shown in FIG. 9. At this point, the first nozzle 14a and third nozzle 14c, which do not pick up electronic components, are also lowered for the stroke H1 following the lowering operation of the second nozzle 14b.

Figure 10:
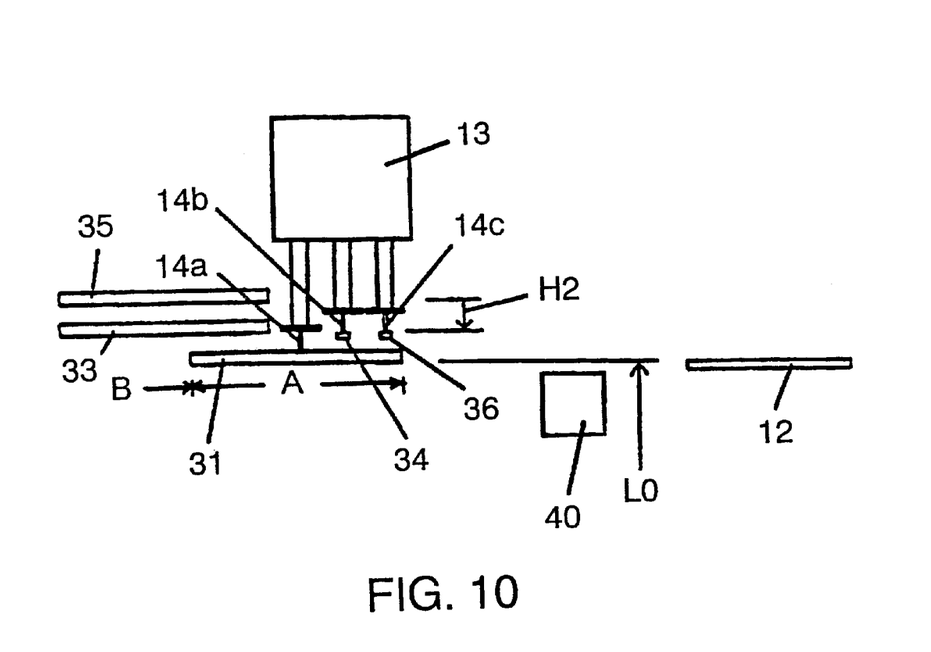

Next, as shown in FIG. 10, the second tray 33 is returned to the standby stage B to expose the first tray 31. The first nozzle 14a is lowered or raised to pick up the first electronic component 32. Here, the second nozzle 14b and third nozzle 14c which have already picked up electronic components also lower for the stroke H2 following the lowering operation of the first nozzle 14a.

Figure 4:
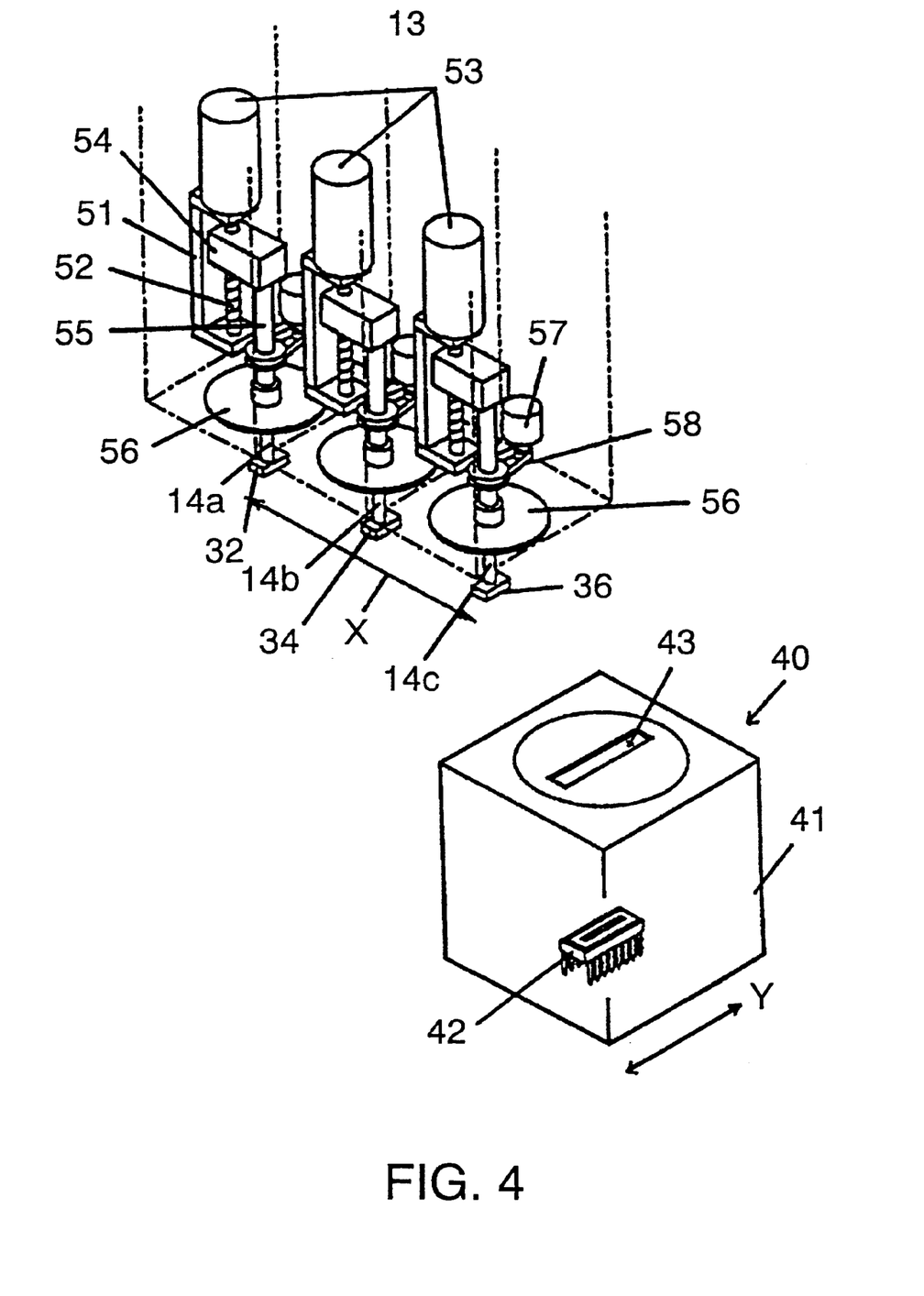
FIG. 4 is a perspective of a transfer head of the electronic component mounting equipment of the present invention.
Figure 11:
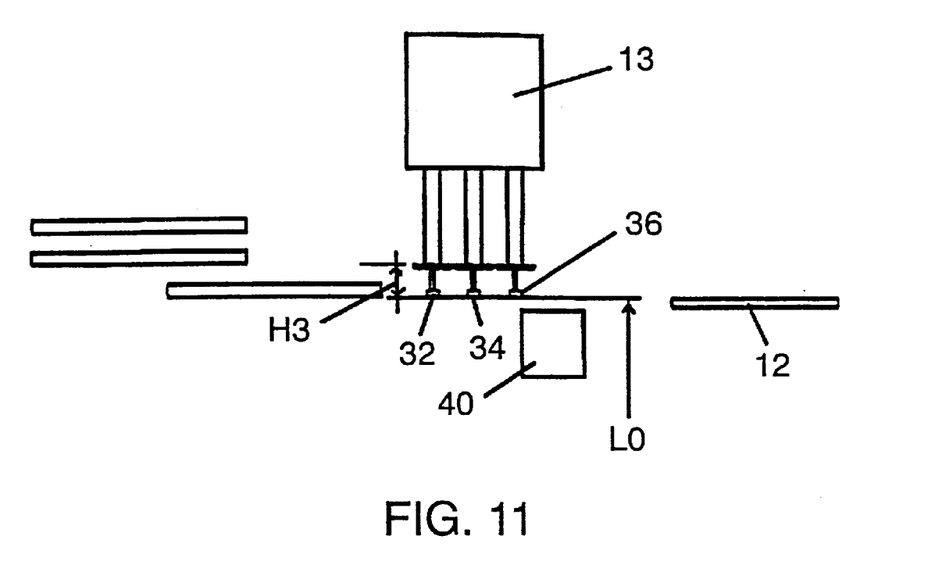

As explained above, after the third nozzle 14c, second nozzle 14b, and first nozzle 14a respectively pick up the third electronic component 36, second electronic component 34, and first electronic component 32 in order, the transfer head 13 moves over the monitoring unit 40 as shown in FIG. 11 for checking any deviation in the position of the third electronic component 36, second electronic component 34, and first electronic component 32 (also refer to FIG. 4).

In this case, all the electronic components 36, 34, and 32 are positioned at the monitoring level L0 of the monitoring unit 40 by driving the z-axis motor 53 to lower the first nozzle 14a, second nozzle 14b, and third nozzle 14c. When picking up the last component as shown in FIG. 10, not only the first nozzle 14a which picks up the first electronic component 32, but also the second nozzle 14b and third nozzle 14c which have already picked up the second electronic component 34 and third electronic component 36, and not picked up electronic components in the process shown in FIG. 10, are already lowered together with the first nozzle 14a. Accordingly, the lowering stroke H3 for lowering the third electronic component 36, second electronic component 34, and first electronic component 32 from the first level L1 to the monitoring level L0 can be made very short. Thus, the three electronic components 36, 34, and 32 can be continuously monitored at high speed in a well arranged manner for detecting positional deviations in the x, y, and θ directions. It is apparent that this lowering stroke H3 can be set at 0 by setting the monitoring unit 40 at a somewhat higher level.

Figure 12:
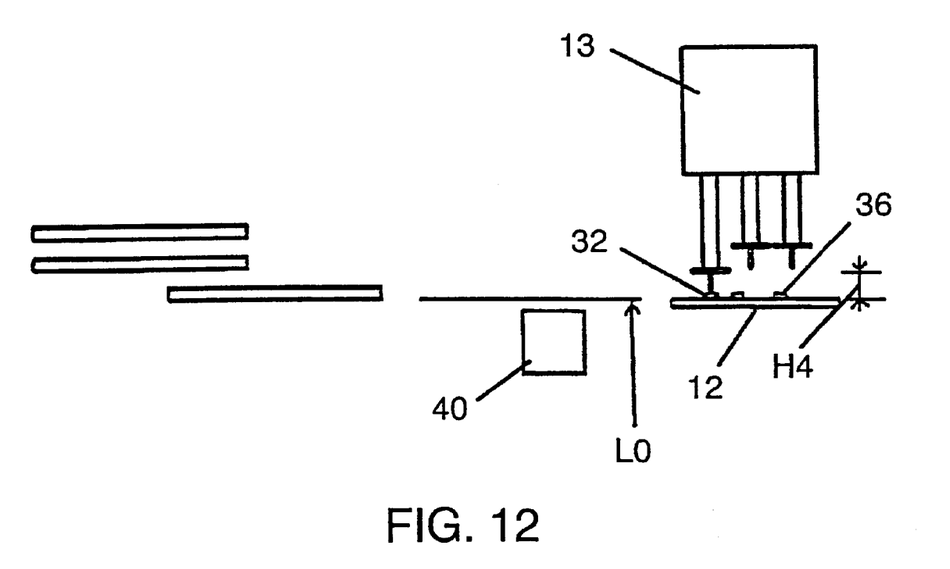

As shown in FIG. 12, the transfer head 13 then moves over the substrate 12, and the third nozzle 14c, second nozzle 14b, and first nozzle 14a lower or rise separately to mount the three electronic components 36, 34, and 32 one by one at specified coordinates on the substrate 12. Also in this case, since the first nozzle 14a, second nozzle 14b, and third nozzle 14c are already lowered to the monitoring level L0, the low level, as shown in FIG. 11, the lowering stroke H4 for mounting the electronic components 36, 34, and 32 can be shortened, enabling high-speed mounting. Deviation in the X and Y directions detected by the monitoring unit 40 is corrected by adjusting the movement stroke of the transfer head 13 relative to the X axis and Y axis of the substrate 12. Deviation in the θ direction is corrected by rotating the nozzle shaft 55 by driving the head motor 57 shown in FIG. 4.

The electronic component mounting equipment of the present invention enables ejection and return of each tray independently to and from the pickup stage at different levels. The nozzle of the transfer head can also be moved vertically in response to the level of each tray positioned on the pickup stage by the vertical movement mechanism so that the required tray can be quickly positioned at the pickup stage at the required time for immediately picking up an electronic component with the nozzle for mounting it on the substrate. In other words, the present invention saves the time required for elevating the magazine and taking in and out the tray after elevation, which was unavoidable with the conventional electronic component mounting equipment, thus shortening the mounting cycle time.

The electronic component mounting method of the present invention enables the ejection and return of a required tray promptly without interfering with other trays by providing more than one level with a certain interval in the vertical direction for ejecting and returning trays to and from the pickup stage. As a result, the mounting cycle time can be shortened.

Moreover, the electronic component mounting method of the present invention positions the transfer head over the trays disposed at more than one vertical level to pick up electronic components from in order of upper tray to lower tray by moving more than one nozzle vertically in order. In addition, the nozzles which do not pick up electronic components follow the lowering operation of the nozzle which picks up an electronic component so that the cycle time required for picking up an electronic component from the tray by vertically moving the nozzles and the cycle time required for moving the nozzles over the substrate and moving the nozzles vertically again to mount electronic components onto the substrate can be greatly shortened. Accordingly, the present invention allows the mounting of electronic components in trays onto the substrate at high speed and with good operability.

We claim:

1. Electronic component mounting equipment comprising:
    a positioning unit for positioning a substrate;
    an electronic component feeding device for supplying electronic components, said electronic feeding device comprising:
        a plurality of tray holders at different height levels for holding trays storing electronic components,
        a support having a plurality of vertical stages supporting said tray holders such that each of said tray holders is horizontally movable at their respective height levels, and
        a moving mechanism disposed with said tray holders for horizontally moving each of said tray holders independently at their respective height levels between a standby stage and a pickup stage; and
    a transfer head movable between said electronic component feeding device and said positioning unit for transferring and mounting supplied electronic components onto the positioned substrate, said transfer head comprising:
        a nozzle for picking up said electronic components by suction, and
        a vertical movement mechanism for vertically moving said nozzle to the height level of one of the trays on the pickup stage.

2. A method for mounting electronic components by moving trays storing electronic components to a pickup stage and picking up the electronic components with a nozzle of a transfer head to mount said electronic components onto a substrate, comprising:
    setting a plurality of stage levels with a certain vertical interval for ejecting and returning the trays to and from the pickup stage;
    positioning the trays at the pickup stage by ejecting the tray at each stage level; and
    picking up the electronic components housed in the trays with the nozzle to mount the electronic components onto said substrate.

3. A method for mounting electronic components by moving electronic components housed in trays disposed in a plurality of vertical stages to a pickup stage, picking up the electronic components with suction with a plurality of nozzles provided on a transfer head, and transferring and mounting the electronic components onto a substrate positioned with a positioning unit, comprising:
    moving the transfer head over the trays disposed in the plurality of vertical stages; and
    vertically moving said plurality of nozzles in sequence to pick up the electronic components from the trays in order from an upper tray to a lower tray, wherein the nozzles which do not pick up the electronic components follow along with a lowering operation of the nozzle which picks up the electronic component.

4. The electronic component mounting equipment of claim 1, further comprising a monitoring unit provided below said transfer head.

* * * * *